United States Patent [19]
Hawkins et al.

[11] Patent Number: 6,126,744
[45] Date of Patent: Oct. 3, 2000

[54] METHOD AND SYSTEM FOR ADJUSTING SEMICONDUCTOR PROCESSING EQUIPMENT

[75] Inventors: Mark Richard Hawkins; Robert Michael Vyne, both of Gilbert, Ariz.; Cornelius Alexander van der Jeugd, Portland, Oreg.

[73] Assignee: ASM America, Inc., Phoeniz, Ariz.

[21] Appl. No.: 08/911,865

[22] Filed: Aug. 15, 1997

Related U.S. Application Data

[60] Provisional application No. 60/031,060, Nov. 18, 1996.

[51] Int. Cl.$^7$ .......................... C30B 23/00; G01K 11/14
[52] U.S. Cl. ............................. 117/85; 117/86; 374/137; 374/162
[58] Field of Search .......................... 117/85, 86; 438/7, 438/16; 374/124, 137, 162; 118/713

[56] References Cited

U.S. PATENT DOCUMENTS

| | | | |
|---|---|---|---|
| 4,234,563 | 11/1980 | Rippe | 436/508 |
| 4,348,803 | 9/1982 | Sasaki | 438/479 |
| 4,538,912 | 9/1985 | Shaw, Jr. | 356/366 |
| 4,659,427 | 4/1987 | Barry et al. | 438/702 |
| 4,891,499 | 1/1990 | Moslehi | 219/502 |
| 5,229,303 | 7/1993 | Donnelly, Jr. et al. | 438/7 |
| 5,258,602 | 11/1993 | Naselli et al. | 219/497 |
| 5,288,364 | 2/1994 | Burt et al. | 117/86 |
| 5,324,683 | 6/1994 | Fitch et al. | 438/422 |
| 5,330,935 | 7/1994 | Dobuzinsky et al. | 438/767 |
| 5,436,172 | 7/1995 | Moslehi | 374/121 |
| 5,497,016 | 3/1996 | Koh | 257/306 |
| 5,504,017 | 4/1996 | Yue et al. | 374/5 |
| 5,564,830 | 10/1996 | Bobel et al. | 374/126 |
| 5,635,409 | 6/1997 | Moslehi | 438/7 |
| 5,773,316 | 6/1998 | Kurosaki et al. | 438/16 |
| 5,775,808 | 7/1998 | Pan | 374/161 |
| 5,825,804 | 10/1998 | Sai | 374/137 |

FOREIGN PATENT DOCUMENTS

| | | |
|---|---|---|
| 0470646 A2 | 8/1991 | European Pat. Off. . |
| 55055520 | 10/1978 | Japan . |
| 8-107078 | 8/1996 | Japan . |
| WO 94/24331 A1 | 4/1994 | WIPO . |

OTHER PUBLICATIONS

Wolf and Tauber, "Silicon Processing for the VLSI Era", vol. 1 (Sunset Beach CA: Lattice Press): 125–128, 1986.

"Comparison of Temperature Control Methods in Cold–Wall Single–Wafer LPCVD System", E.G. Colgan, K.Y. Ahn and P.M. Fryer, 1989 Materials Research Society, pp. 205–209.

"Nondestructive Determination of Thickness and Refractive Index of Transparent Films", W. A. Pliskin and E.E. Conrad, IBM Journal, Jan. 1964, pp. 43–51.

"Deposition and Electrical Properties of In Situ Phosphorus–Doped Silicon Films Formed by Low–Pressure Chemical Vapor Deposition", Arthur J. Learn and Derrick W. Foster, Journal of Applied Physics, Mar. 1, 1987, vol. 61, No. 5, pp. 1898–1904.

(List continued on next page.)

*Primary Examiner*—William Powell
*Assistant Examiner*—Donald L. Champagne
*Attorney, Agent, or Firm*—Knobbe, Martens Olson, & Bear, LLP

[57] ABSTRACT

A method to prepare thermal reactors for operation after installation, modification, upgrade and routine preventive maintenance operations. Variations in reaction rate across a wafer surface are used to determine corresponding variations in surface temperature across the wafer surface. Surface temperature variations results in thickness variations of a chemically deposited layer. For selected thicknesses, a chemically deposited layer is transparent and exhibits color variations corresponding to the thickness variations that result from the surface temperature variations. These color variations are then correlated to surface temperature variations to enable wafer heating adjustments to reduce surface temperature variations.

24 Claims, 11 Drawing Sheets

350 →

| APPROXIMATE THICKNESS | OBSERVED COLOR | APPROXIMATE TEMPERATURE DIFFERENCE | ADJUSTMENT |
|---|---|---|---|
| 100Å | BLUE | −15 °C | INCREASE OFFSET BY 15°C |
| 250Å | SILVER | −7 °C | INCREASE OFFSET BY 7°C |
| 450Å | GOLD | 0 °C | NO ADJUSTMENT REQUIRED |
| 550Å | PINK | +8 °C | DECREASE OFFSET BY 8°C |
| 750Å | BLUE | +15 °C | DECREASE OFFSET BY 15°C |
| 900Å | GREEN | +23 °C | DECREASE OFFSET BY 23°C |
| 1100Å | GOLD | +30 °C | DECREASE OFFSET BY 30°C |
| 1200Å | PINK | +38 °C | DECREASE OFFSET BY 38°C |

OTHER PUBLICATIONS

"Deposition Properties of Silicon Films Formed From Silane in a Vertical–Flow Reactor", Derrick W. Foster, Arthur J. Learn and T. I. Kamins, Journal of Vacuum Science & Technology B, Second Series, vol. 4, No. 5, Sep./Oct. 1986, pp. 1182–1186.

"Semi–Insulating Polysilicon (SIPOS) Deposition in a Low Pressure CVD Reactor", Michael L. Hitchman and James Kane, Journal of Crystal Growth 55 (1981), pp. 485–500, North–Holland Publishing Company.

"Polysilicon Growth Kinetics in a Low Pressure Chemical Vapour Deposition Reactor", M.L. Hitchman, J. Kane and A. E. Widmer, Thin Solid Films, 59 (1989) pp. 231–247.

"Is the Vacancy in Amorphous Silicon Difference from Crystalline Silicone?", Eunja Kim and Young Hee Lee, Department of Physics and Semiconductor Physics Research Center, Jeonbuk National University, pp. 2685–2688.

"Chemical Reaction Mechanism of Etching Process by Chlorine on Silicon", Koichi Kato, pp. 529–532, Lockwood, D.J. (Ed.), Proceedings of the $22^{nd}$ International Conference on the Physics of Semiconductors, vol. 1, Aug. 15–19, 1994, Vancouver, BC, Canada (Singapore: World Scientific, 1995).

"Thermodynamic Properties and Phase Diagram of Silicon from First–Principles", Osamu Sugino and Roberto Car, pp. 197–200, Lockwood, D.J.(Ed.), Proceedings of the $22^{nd}$ International Conference on the Physics of Semiconductors, vol. 1, Aug. 15–19, 1994, Vancouver, BC, Canada (Singapore: World Scientific, 1995.)

"Thermal Model Validation for Rapid Thermal Chemical Vapor Deposition of Polysilicon", Charles Schaper and Thomas Kailath, J. Electrochem. Soc., vol. 143, No. 1, Jan. 1996, pp. 374–381.

"A Mathematical Model of the Hydrodynamics and Gas–Phase Reactions in Silicon LPCVD in a Single–Wafer Reactor" C. R. Kleijn, J. Electrochem. Soc., vol. 138, No. 7, Jul. 1991, pp. 2190–2200.

"The Formation of Boron–Doped Polycrystalline Si with Extremely Low Resistivities at Low Temperatures", Junichi Shiozawa, Yoshio Kasai, Yuu–ichi Mikata, and Kikuo Yamabe, J. Electrochem. Soc., vol. 141, No. 5, May 1994, pp. 1334–1338.

"Rugged Surface Polycrystalline Silicon Film Deposition and Its Application in a Stacked Dynamic Random Access Memory Capacitor Electrode", M. Ino. J. Miyano, H. Kurogi, H. Tamura, Y. Nagatomo and M. Yoshimaru, J. Vac. Sci. Technol. B 14(2), Mar./Apr. 1996, pp. 751–756.

W. M. Cranton, D. M. Spink, R. Stevens and C. B. Thomas, Growth and dielectric characterization of yttrium oxide thin films deposited on Si by r.f.–magnetron sputtering, 2194 Thin Solid Films, 226 (1993) Apr. 15, No. 1, Lausanne, CH.

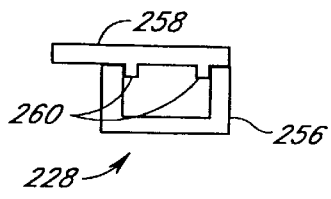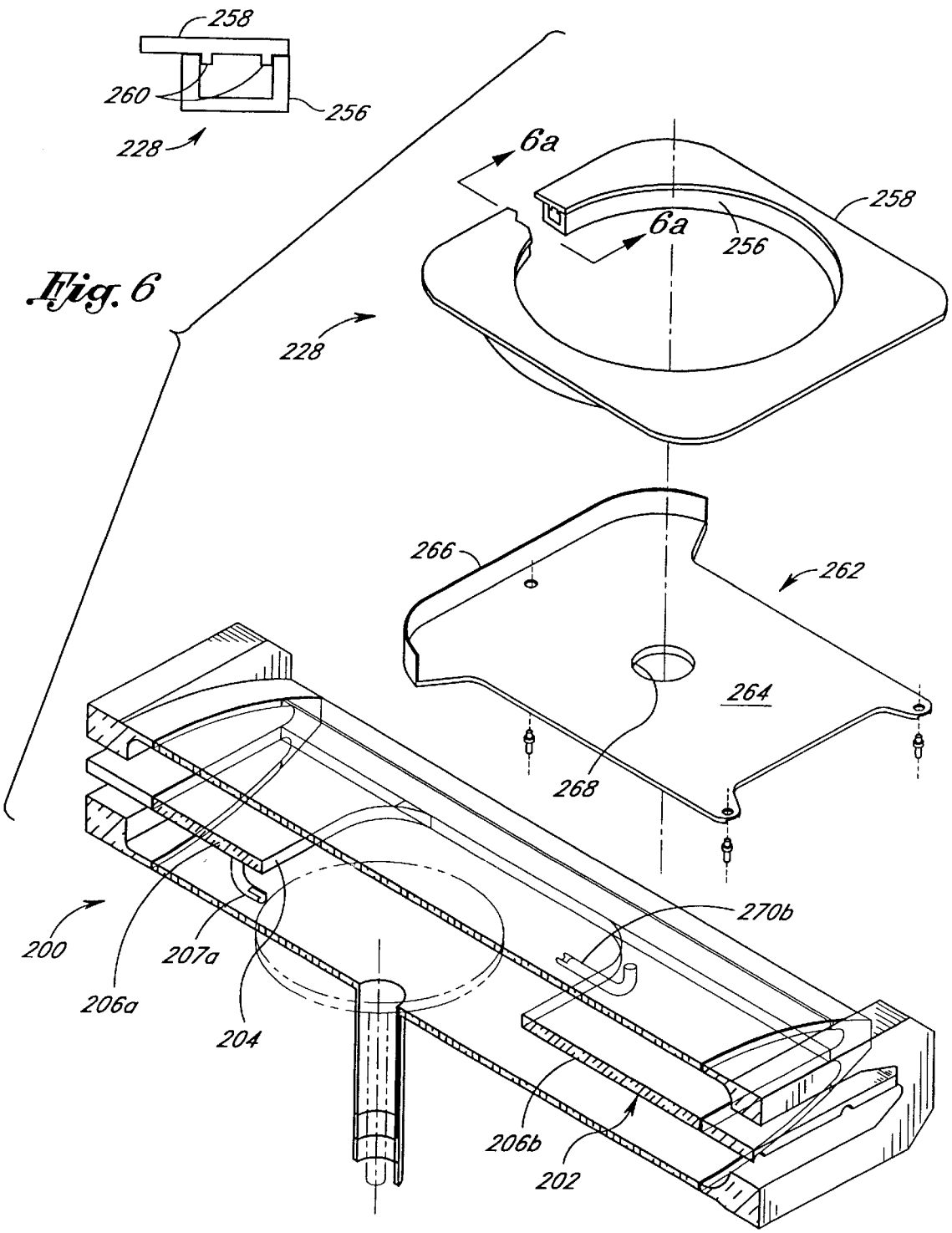

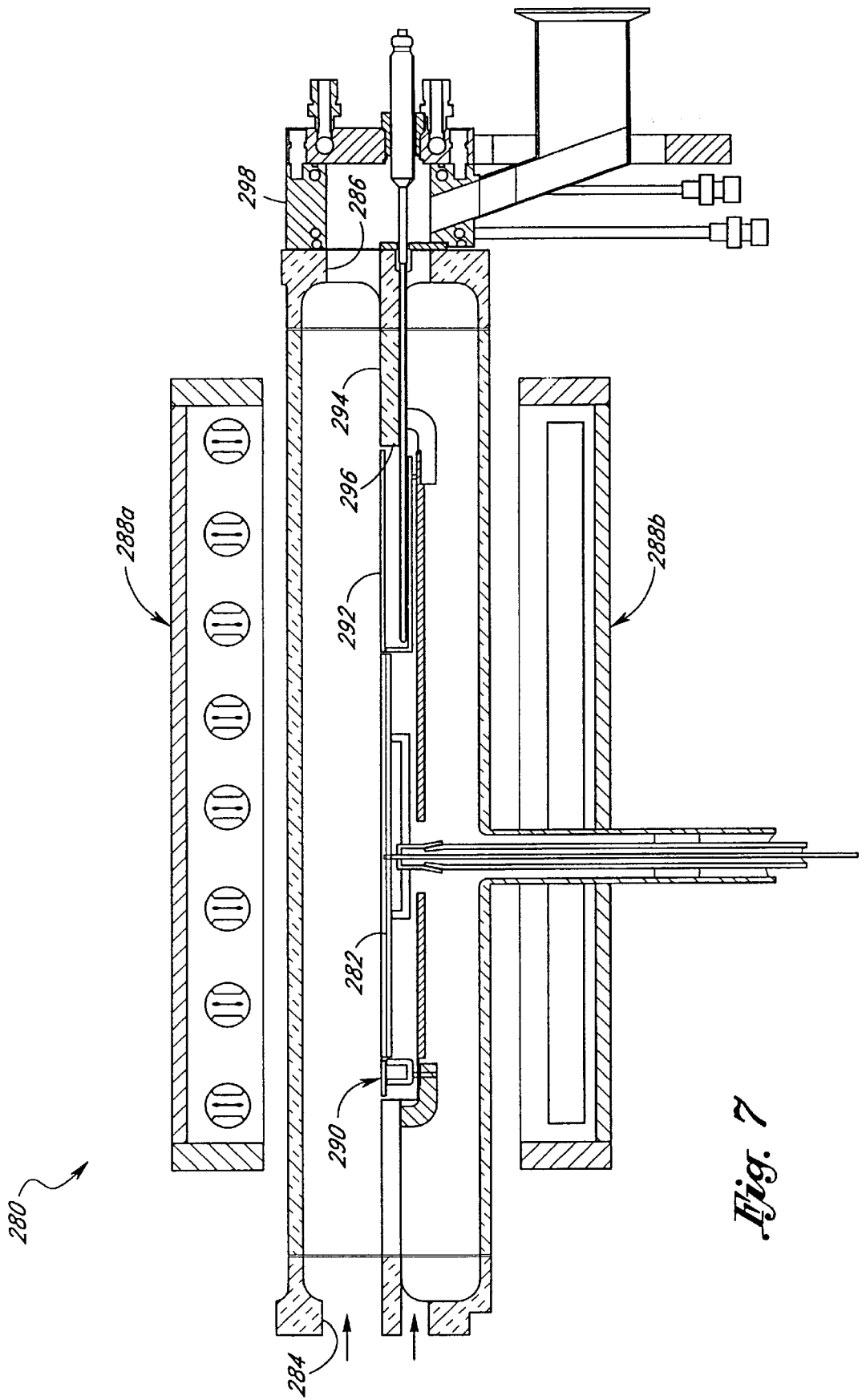

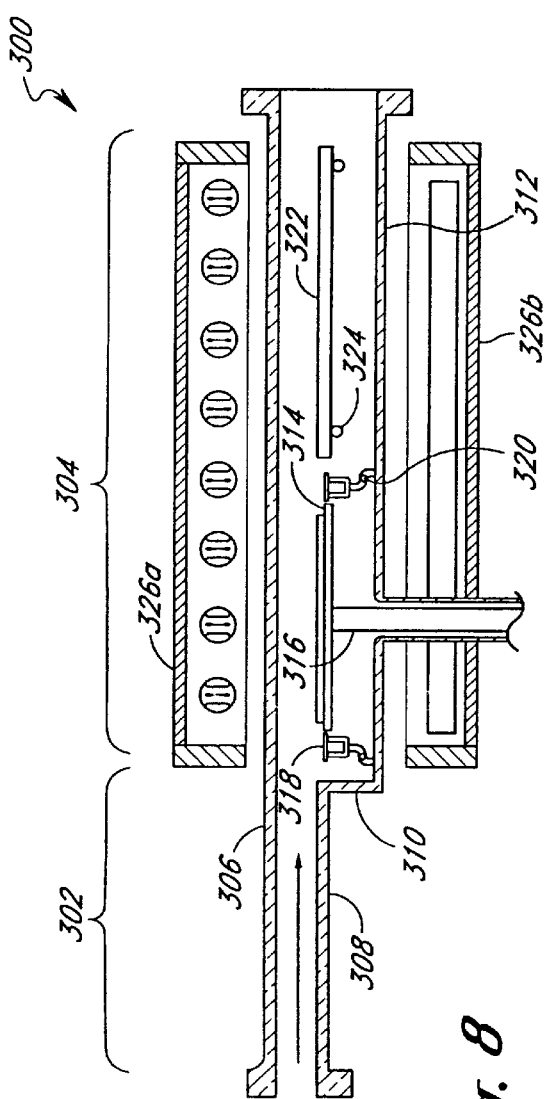
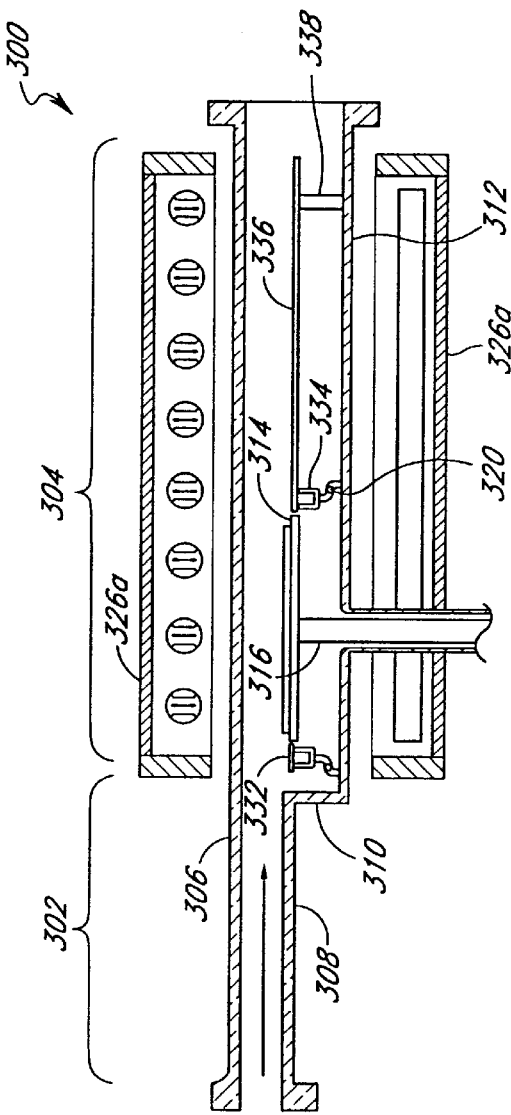

| FILM THICKNESS (MICRONS) | COLOR AND COMMENTS | FILM THICKNESS (MICRONS) | COLOR AND COMMENTS |
|---|---|---|---|
| 0.050 | TAN | 0.68 | "BLUISH" |
| 0.075 | BROWN | 0.72 | BLUE-GREEN TO GREEN |
| 0.100 | DARK TO RED VIOLET | 0.77 | "YELLOWISH" |
| 0.125 | ROYAL BLUE | 0.80 | ORANGE (RATHER BROAD FOR ORANGE) |
| 0.150 | LIGHT TO METALLIC BLUE | 0.82 | SALMON |
| 0.175 | METALLIC TO VERY LIGHT YELLOW-GREEN | 0.85 | DULL, LIGHT RED-VIOLET |
| 0.200 | LIGHT GOLD OR YELLOW--SLIGHTY METALLIC | 0.86 | VIOLET |
| 0.225 | GOLD WITH SLIGHT YELLOW ORANGE | 0.87 | BLUE-VIOLET |
| 0.250 | ORANGE TO MELON | 0.89 | BLUE |
| 0.275 | RED-VIOLET | 0.92 | BLUE-GREEN |
| 0.300 | BLUE TO VIOLET-BLUE | 0.95 | DULL YELLOW-GREEN |
| 0.310 | BLUE | 0.97 | YELLOW TO "YELLOWISH" |
| 0.325 | BLUE TO BLUE-GREEN | 0.99 | ORANGE |
| 0.345 | LIGHT GREEN | 1.00 | CARNATION PINK |
| 0.350 | GREEN TO YELLOW-GREEN | 1.02 | VIOLET-RED |
| 0.365 | YELLOW-GREEN | 1.05 | RED-VIOLET |
| 0.375 | GREEN-YELLOW | 1.06 | VIOLET |
| 0.390 | YELLOW | 1.07 | BLUE-VIOLET |
| 0.412 | LIGHT ORANGE | 1.10 | GREEN |
| 0.426 | CARNATION PINK | 1.11 | YELLOW-GREEN |
| 0.443 | VIOLET-RED | 1.12 | GREEN |
| 0.465 | RED-VIOLET | 1.18 | VIOLET |
| 0.476 | VIOLET | 1.19 | RED-VIOLET |
| 0.480 | BLUE-VIOLET | 1.21 | VIOLET-RED |
| 0.493 | BLUE | 1.24 | CARNATION PINK TO SALMON |
| 0.502 | BLUE-GREEN | 1.25 | ORANGE |
| 0.520 | GREEN (BROAD) | 1.28 | "YELLOWISH" |
| 0.540 | YELLOW-GREEN | 1.32 | SKY BLUE TO GREEN-BLUE |
| 0.560 | GREEN-YELLOW | 1.40 | ORANGE |
| 0.574 | YELLOW TO "YELLOWISH" | 1.45 | VIOLET |
| 0.585 | LIGHT ORANGE OR YELLOW TO PINK BORDERLINE | 1.46 | BLUE-VIOLET |
| 0.60 | CARNATION PINK | 1.50 | BLUE |
| 0.63 | VIOLET-RED | 1.54 | DULL YELLOW-GREEN |

Fig. 10
(PRIOR ART)

| APPROXIMATE THICKNESS | OBSERVED COLOR | APPROXIMATE TEMPERATURE DIFFERENCE | ADJUSTMENT |
| --- | --- | --- | --- |
| 100 Å | BLUE | −15 °C | INCREASE OFFSET BY 15°C |
| 250 Å | SILVER | −7 °C | INCREASE OFFSET BY 7°C |
| 450 Å | GOLD | 0 °C | NO ADJUSTMENT REQUIRED |
| 550 Å | PINK | +8 °C | DECREASE OFFSET BY 8°C |
| 750 Å | BLUE | +15 °C | DECREASE OFFSET BY 15°C |
| 900 Å | GREEN | +23 °C | DECREASE OFFSET BY 23°C |
| 1100 Å | GOLD | +30 °C | DECREASE OFFSET BY 30°C |
| 1200 Å | PINK | +38 °C | DECREASE OFFSET BY 38°C |

Fig. 11

METHOD AND SYSTEM FOR ADJUSTING SEMICONDUCTOR PROCESSING EQUIPMENT

RELATED APPLICATION

This application claims the benefit of the filing date of U.S. provisional patent application Ser. No. 60/031,060, filed Nov. 18, 1996, for "METHOD AND SYSTEM FOR ADJUSTING SEMICONDUCTOR PROCESSING EQUIPMENT" to Mark R. Hawkins, et al.

BACKGROUND OF THE INVENTION

1. Field of the Invention

The present invention relates to microelectronic device fabrication, and more particularly, to a method and system for adjusting semiconductor wafer fabrication equipment so as to improve temperature control and process uniformity.

2. Description of the Related Technology

Thermal processing of semiconductors is a powerful technique for fabrication of ultra-large-scale integrated (ULSI) electronic devices. Numerous silicon fabrication technologies use thermal processing techniques, including thermal oxidation, nitridation, dopant diffusion, epitaxy and thermal annealing. Refractory metal silicide formation and chemical vapor deposition (CVD) are other significant silicon device fabrication processes that benefit from thermal reactors. For example, CVD is useful in the formation of dielectric oxides and nitrides in addition to amorphous silicon and polysilicon, as well as conductors, such as aluminum, copper, tungsten, and titanium nitride.

A thermal reactor common in the art employs two banks of heating lamps arranged in orthogonal or crossed directions above and below a susceptor holding a semiconductor wafer. Each surface of the semiconductor wafer faces one of the two banks of heating lamps. A controller within the thermal reactor adjusts relative power to each lamp to maintain a desired temperature during wafer processing. The controller receives signals indicative of wafer temperatures from temperature probes, such as a set of pyrometers or thermocouples. The controller uses these temperature signals to make adjustments to the heating lamps to ensure a uniform temperature across the wafer surface.

To place the reactor in an operating condition, the heating lamps require various adjustments prior to wafer processing. For example, one may need to adjust the position of the heating lamps as well as their orientation relative to a wafer in the chamber. Similarly, each temperature sensor, such as a pyrometer or thermocouple, generally requires a controller set point adjustment to account for variances in the sensitivity and accuracy of each sensor, as well as their position relative to the wafer. While some efforts have been made to measure thickness to make these adjustments as described by Shaper et al. in *J. Electrochem. Soc.*, 143, 374 (1996), such efforts are cumbersome, time-consuming and complicated requiring numerous thickness measurements, optimization studies and curve fitting. Currently, these adjustments to place the thermal reactor in an operating condition are very tedious and costly to make. For example, in a thermal reactor used for silicon epitaxy, crystal structure defects, such as slip planes, dislocations and stacking faults, may result from temperature variations across the wafer surface. These defects are the only evidence available to a maintenance technician to identify and make wafer heating changes to eliminate the defects. However, the defects provide no indication as to the location or the magnitude of surface temperature variations caused by the heating lamps.

Thus, equipment maintenance technicians employ a trial and error process to make the necessary adjustments to minimize surface temperature differences. For example, a slip plane defect in a silicon epitaxy layer appears as a line when viewed on an interference/contrast microscope using 50X magnification. The maintenance technician inspects the defective wafer to identify the slip plane defects and their locations to make adjustments. After completing the adjustments, the maintenance technician processes another production wafer to surmise the effectiveness of the adjustments. In all likelihood, this production wafer includes different slip plane defects. Thus, the maintenance technician makes additional adjustments to compensate for the different slip plane defects and continues this iterative trial and error process until no defects result after processing a production wafer. The inherent inefficiency of the trial and error method causes the semiconductor manufacturer to lose valuable production time as well as production wafers.

Maintenance technicians may also use an instrumented wafer to determine changes needed to minimize surface temperature variation. An instrumented wafer is a standard silicon wafer having a plurality of thermocouples mounted through its top surface. Each thermocouple provides signals indicative of the wafer temperature at its mounting location through metal wires connected to a data acquisition device. To use the instrumented wafer, a thermal reactor must be configured to receive the thermocouples and their associated metal wiring. Wafer processing conditions are then simulated in the thermal reactor while the plurality of thermocouples provide signals indicative of the wafer surface temperature profile to a data acquisition device for later analysis. A maintenance technician then analyzes the temperature profile data from the data acquisition device to determine changes needed to minimize surface temperature variations.

Unfortunately, the instrumented wafer thermocouples routinely fail after one to two hours of use under standard wafer processing conditions. Similarly, the thermocouples often provide false readings under the hydrogen flows of standard wafer processing conditions. In addition, the presence of the metal wiring associated with the instrumented wafer thermocouples creates an unacceptable risk of contamination to many semiconductor manufacturers. Other semiconductor manufacturers require a thermal reactor reconstruction or chamber clean after any use of the instrumented wafer. Moreover, frequent thermocouple failures and false thermocouple readings decrease the reliability of the temperature data acquired and thus the effectiveness of any adjustments made in response to this temperature data. Lastly, use of the instrumented wafer incurs substantial costs to procure an instrumented wafer, to reconfigure the thermal reactor to receive an instrumented wafer and to obtain and analyze the instrumented wafer data.

Furthermore, thermal reactors often require routine preventive maintenance to ensure repeatable and reliable performance. In some cases, the preventive maintenance operations occur as frequently as once per week. This causes a significant amount of down time whereby a semiconductor manufacturer loses productivity of the reactor during the maintenance operation. To compound the loss of productivity, the reactors often require adjustments to the lamps and temperature sensors to return the reactor to operating condition after maintenance operations. As discussed above, these adjustments are tedious, time consuming and costly. To ensure efficient, cost-effective fabrication of microelectronic devices, semiconductor manufacturers require a simple and effective method to place their thermal reactors in operating condition after installation and routine preventive maintenance operations.

SUMMARY OF THE INVENTION

The present invention utilizes variations in reaction rate across a wafer surface to determine corresponding variations in surface temperature across the wafer. Surface temperature variations result in thickness variations of a chemically deposited layer. For selected thicknesses, a chemically deposited layer is transparent and exhibits color variations corresponding to the thickness variations that result from surface temperature variations. These color variations are then correlated to surface temperature variations to enable wafer heating adjustments to reduce surface temperature variations.

The present invention thus provides an efficient method to prepare thermal reactors for operation after installation, modification, upgrade and routine preventive maintenance operations. The present invention enables the rapid adjustment of thermal reactors and substantially reduces reactor down time for non-production uses. In addition, the present invention eliminates the need for expensive instrumented wafers to determine temperature variations as well as the risk of introducing incompatible materials from the instrumented wafer into the thermal reactor. Moreover, the present invention is useful for determining if process non-uniformities and defects are due to temperature variations.

One aspect of the present invention includes a method of determining adjustments needed to improve temperature control in a reactor comprising the steps of forming a layer of a selected thickness on a monitor wafer in the reactor, observing color variations from above the layer and determining the adjustments corresponding to the color variations.

Another aspect of the present invention includes a method of checking adjustments to improve temperature control in a reactor comprising the steps of forming a first layer of a selected thickness on a first monitor wafer in the reactor, observing first color variations from above the first layer, determining a first adjustment corresponding to the first color variations, making the first adjustment to the reactor, forming a second layer of the selected thickness on a second monitor wafer in the reactor and observing second color variations from above the second layer.

Lastly, yet another aspect of the present invention includes a method of preparing a color chart comprising the steps of forming a layer of a selected thickness on a monitor wafer in a reactor, identifying at least one region of the layer having a single color, determining a thickness of the at least one region having the single color and determining a temperature difference corresponding to the thickness of the at least one region having the single color.

BRIEF DESCRIPTION OF THE DRAWINGS

FIG. 6 is an exploded perspective view of a second embodiment of the process chamber of FIG. 5 incorporating an enlarged temperature compensation ring and a sacrificial quartz plate.

FIG. 6a is a cross-sectional view of the temperature compensation ring.

FIG. 7 is a cross-sectional view of a further embodiment of a process chamber incorporating a modified temperature compensation ring surrounding a susceptor and extending downstream of the susceptor and wafer to be processed.

FIG. 8 is a cross-sectional view of an alternative process chamber having a structure downstream from a temperature compensation ring.

FIG. 9 is a cross-sectional view of the process chamber of FIG. 8 having a temperature compensation ring extended downstream.

FIG. 10 is a table illustrating the correspondence between color observations and layer thickness for a silicon dioxide thin film.

FIG. 11 is a table illustrating a color chart showing the correspondence between color and thermal reactor adjustments of the present invention.

DETAILED DESCRIPTION OF THE PREFERRED EMBODIMENT

The following detailed description of the preferred embodiments presents a description of certain specific embodiments to assist in understanding the claims. However, one may practice the present invention in a multitude of different embodiments as defined and covered by the claims.

For convenience, the description comprises three sections: Thermal Reactor, Wafer Monitor Process and Summary. The first section provides an overview of a preferred embodiment of a thermal reactor for practicing the present invention, the following section describes the wafer monitor process and preferred embodiments for practicing the wafer monitor process of the present invention, and the remaining section summarizes advantageous features of the present invention.

I. Thermal Reactor

Figure 1:
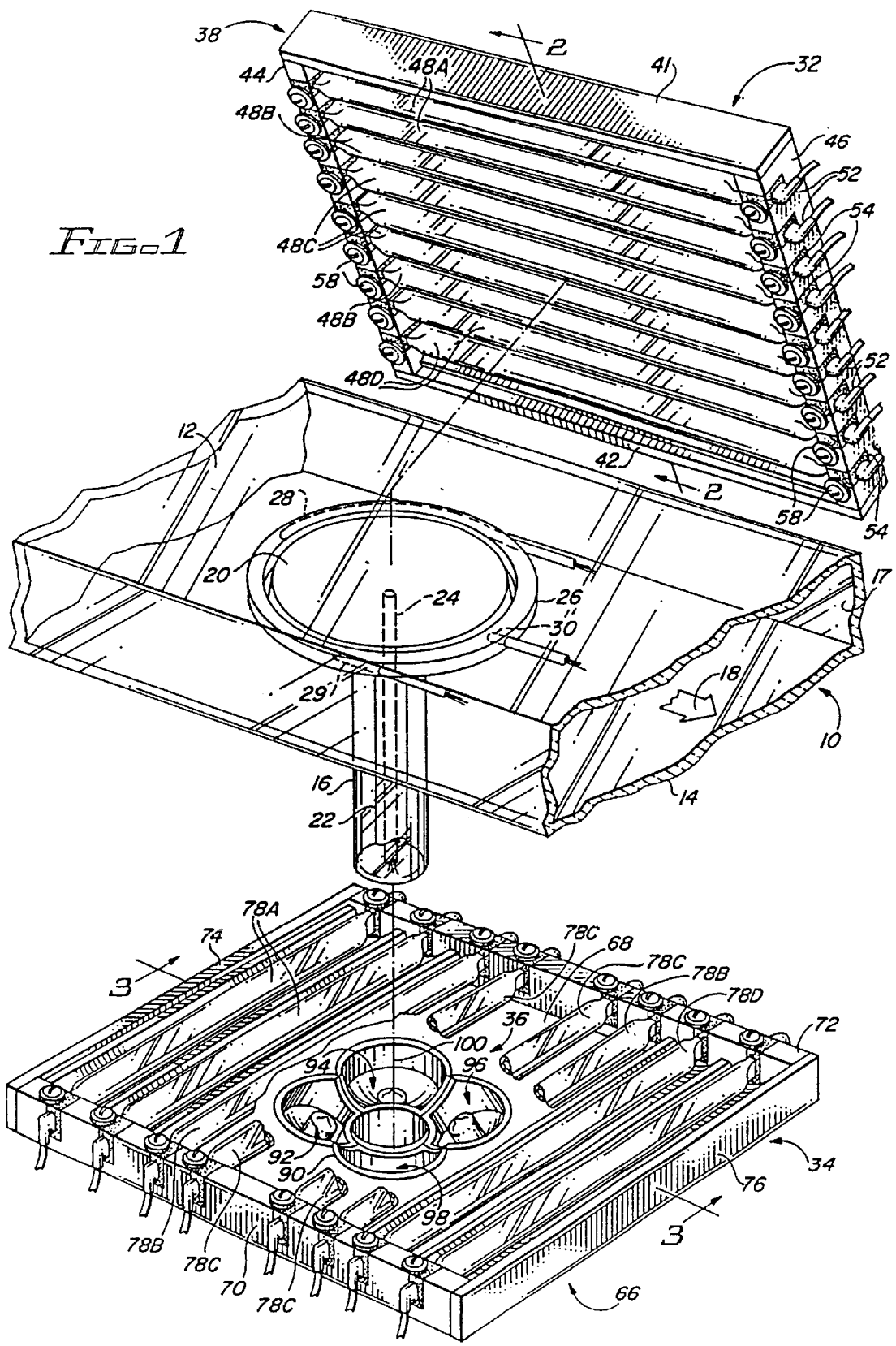
FIG. 1 is a perspective view of the heating system of the present invention which is shown in exploded relationship with a reaction chamber, rotatable circular susceptor and a temperature sensing arrangement of a particular chemical vapor deposition system.

As described in detail in U.S. Pat. No. 4,846,102, issued Jul. 11, 1989, entitled IMPROVED REACTION CHAMBERS FOR CVD SYSTEMS, hereby expressly incorporated by reference, the system as indicated in FIG. 1 includes a reaction chamber 10 of the horizontal flow type which is formed of a material which is transparent to radiant heat energy such as fused quartz. The reaction chamber 10 includes a planar top wall 12, a planar bottom 1 with a tubular shaft 16 depending therefrom, and the chamber defines a gas flow passage 17. A reactant gas is caused to flow in the reaction chamber 10 in a direction indicated by the arrow 18 for the purpose of depositing materials on a substrate 19 (FIGS. 2 and 3) which is placed in the reaction chamber at the beginning of a deposition cycle and is removed therefrom after the cycle is completed.

As described in U.S. Pat. No. 4,821,674, issued Apr. 3, 1989, for ROTATABLE SUBSTRATE SUPPORTING MECHANISM WITH HEAT SENSING DEVICE FOR USE IN CHEMICAL VAPOR DEPOSITION EQUIPMENT, hereby expressly incorporated by reference, a substrate is supported on a platform-like structure which is commonly referred to in the art as a susceptor which is indicated herein by the reference numeral 20. The susceptor 20 is circular and is supported on and rotatably driven by a drive shaft assembly 22 which extends downwardly from the reaction chamber 10 coaxially through the tubular shaft 16 of the reaction chamber 10. A temperature sensing arrangement is provided as part of the substrate supporting mechanism which includes a master temperature sensor 24 that extends axially upwardly through the drive shaft assembly 22 for sensing the temperature at the center of the susceptor 20 and producing signals indicative of the sensed temperature. A temperature compensation and sensor ring 26 is also supported in the reaction chamber 10 in concentric relationship with the rotatable susceptor. The ring 26 is configured to contain a plurality of slave temperature sensors 28, 29 and 30 located to sense the temperatures at various points about the periphery of the susceptor 20 and produce signals indicative of the sensed temperatures.

The heating system of the present invention includes the major components of an upper heating element assembly 32, a lower heating element assembly 34 and a heat concentrator 36. The upper heating element assembly 32 includes a generally rectangular housing 38 having a planar top wall 40, a spaced pair of sidewalls 41 and 42, and a spaced pair of endwalls 44 and 46 which cooperatively define a downwardly opening chamber. A plurality of elongated tube-type radiant heating elements 48A, 48B, 48C and 48D are mounted in the downwardly opening chamber of the housing 38 and are disposed in generally spaced parallel relationship with respect to each other and lie on axes which are substantially parallel with respect to the reactant gas flow path through the reaction chamber 10.

Each of the heating elements 48A, 48B, 48C and 48D is preferably a high intensity tungsten filament lamp having a transparent quartz envelope which contains a halogen gas such as iodine. The heating elements produce radiant heating energy of short wavelength, preferably on the order of one micron, and this energy is transmitted through the reaction chamber walls without appreciable absorption.

Although the lamps may be of different wattages, they are of similar configuration. Therefore, the following description of one of the lamps 48C and its mounting applies to the other lamps as well.

Figure 2:
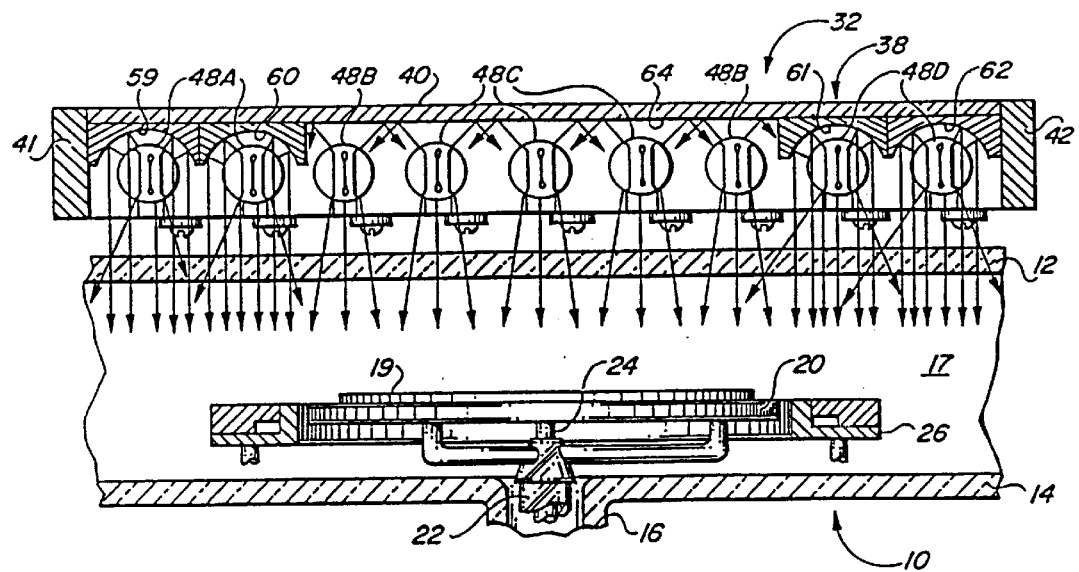
FIG. 2 is an enlarged section view along the line 2—2 of FIG. 1 to show the various features of the upper heating elements assembly and its relationship to the reaction chamber rotatable circular susceptor and temperature sensing arrangement of the deposition system.

As seen in FIG. 2, elongated linear concave reflective surfaces 59 and 60 which may be parabolic or elliptical segments in cross-section, are provided above the two radiant heat lamps 48A which are proximate the sidewall 41 of the housing 38 and two similar elongated linear concave reflective surfaces 61 and 62 are provided above the lamps 48D which are proximate the opposite sidewall 42 of the housing. The reflective surfaces 59, 60, 61 and 62 may be formed integral with the top wall 40 of the housing 38, or as shown, may be formed as separate elements which are welded or otherwise mounted in the housing 38. In any case, the elongated heat lamps 48A are located at the focal point of their concave reflective surfaces 59 and 60 so that the radiated heat energy which impinges on the concave reflective surfaces will be reflected into generally parallel paths as indicated by the arrows. Similarly, the heat lamps 48D are located at the focal points of their respective concave reflective surfaces 61 and 62 to produce generally parallel reflected rays of heat energy as indicated. The reflected energy is directed at the temperature sensor ring 26 and cooperates with the directly radiated heat energy to concentrate heat energy at the diametrically opposed lateral edges of the susceptor 20 to compensate for heat losses which inherently occur at the periphery of the susceptor 20, and, of course, at the peripheral edges of a substrate 19 supported on the susceptor.

The exposed planar portion of the inner surface 64 of the top wall 40 of the housing 38 is also highly reflective so that both direct and reflected radiant heat energy from the elongated heating lamps 48B and 48C will pass through the top wall 12 of the reaction chamber 10 and impinge on the upper surfaces of the ring 26, the susceptor 20, and, of course, on the substrate 19 supportable thereon. Thus, the radiant energy which is directed onto the substrate per se will be of a more diffuse nature than the concentrated energy directed onto the ring.

The lower heating element assembly 34 is similar to the above-described upper assembly 32 and includes a generally rectangular housing 66 having a planar bottom wall 68, a spaced pair of sidewalls 70 and 72 and a spaced pair of endwalls 74 and 76 which cooperatively define an upwardly opening chamber. A plurality of elongated tube-type radiant heating elements 78A, 78B, 78C and 78D are mounted in the upwardly opening chamber of the housing 66 and are disposed in spaced generally parallel relation with respect to each other and lie on axes which are substantially transverse with respect to the reactant gas flow path through the reaction chamber 10 and are, therefore, transverse with respect to the heating lamps 48A–48D of the upper heating element assembly.

Each of the lamps 78A, 78B, 78C and 78D may be identical with the lamps 48A–48D and, thus, are high intensity tungsten filament lamps having a halogen gas contained within transparent quartz envelopes. Further, the radiant heating lamps 78A–78D may be mounted in the housing 66 in the manner described for the lamps 48A–48D.

Figure 3:
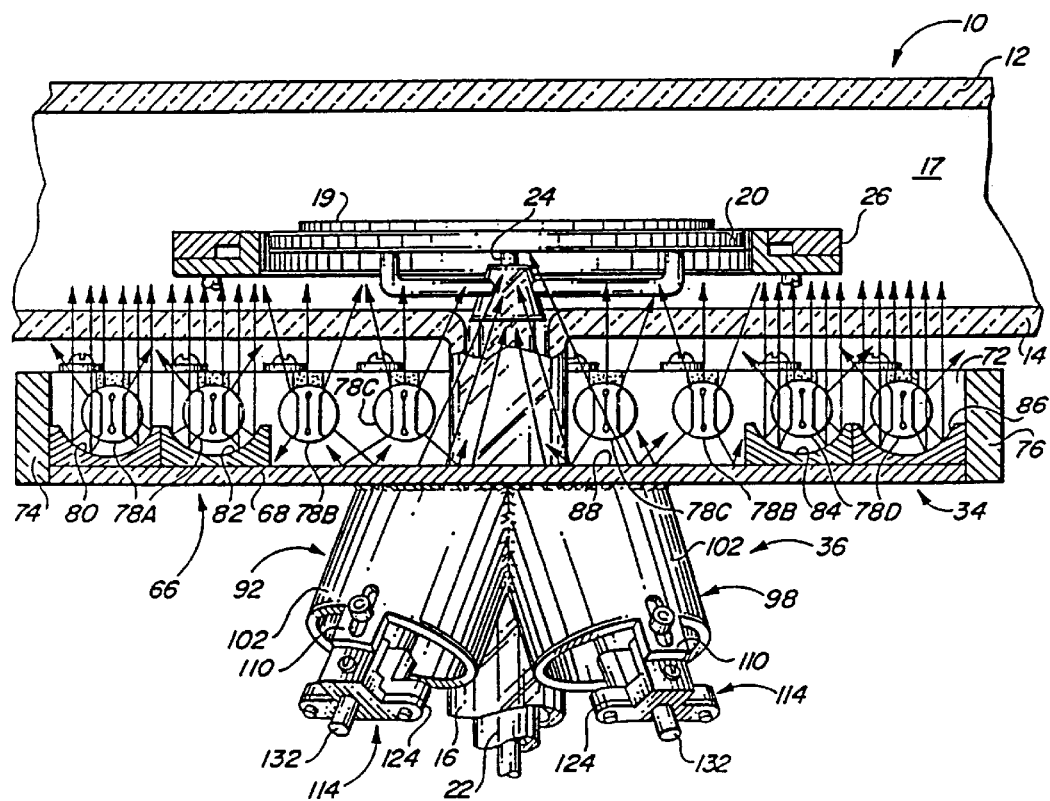
FIG. 3 is an enlarged sectional view taken along the line 3—3 of FIG. 1 to show the various features of the lower heater element assembly and the heat concentrator means and their relationship to the reaction chamber, the rotatable circular susceptor and the temperature sensing arrangement of the deposition system.

As shown in FIG. 3, elongate4 linear concave reflective surfaces 80 and 82, which may be parabolic or elliptical segments in cross-section, are provided immediately below the two heating lamps 78A which are proximate the endwall 74 of the housing 66 and two similar elongted linear concave reflective surfaces 84 and 86 are located below the two lamps 78D that are proximate the opposed sidewall 76 of the housing. The reflective concave surfaces 80, 82, 84 and 86 may be formed integrally in the bottom wall 68 of the housing 66 or may be formed as separate elements which are suitably mounted in the housing as shown. In any case, the reflective concave surfaces 80, 82, 84 and 86 cooperate with their respective heat lamps 78A and 78D which are located at the focal points of the surfaces, to produce parallel radiant heat energy which is reflected onto the ring 26 and cooperates with the directly radiated heat energy to concentrate the radiated heat energy at the diametrically opposed peripheral edges of the susceptor 20 which may be described as the upstream, or leading, edge of the susceptor and the downstream, or trailing, edge of the susceptor.

The exposed planar portion of the inner surface 88 bottom wall 68 of the housing 66 is also highly reflective so that both direct and reflected radiant heat energy from the heat lamp 78B and 78C are directed through the bottom wall 14 of the reaction chamber 10 for heating the ring 26 and the susceptor 20. Thus, the radiant energy directed onto the lower surface of the susceptor will be diffuse.

In view of the above-detailed description, it will be seen that radiant heat energy from the upper heating element assembly 32 will heat the ring 26, the susceptor 20 and the substrate 19 from the top, and the lower heating element assembly 34 will do the same from the bottom. Furthermore, by virtue of the elongated concave reflective surfaces 59, 60, 61 and 62 of the upper assembly 32, concentrated heating zones or regions are provided in the vicinity of the diametrically opposed side edges, i.e., those adjacent the sidewalls of the reaction chamber 10, of the ring 26, susceptor 20 and substrate 19. Similarly, by virtue of the elongated concave reflective surfaces 80, 82, 84 and 86 of the lower heating assembly 34, transverse concentrated heating zones, or regions are provided in the vicinity of the diametrically opposed front and back edges, i.e., those upstream and downstream of the reactant gas path through the reaction chamber 10, of the ring 26, susceptor 20 and the substrate 19.

The bottom wall 68 of the housing 66 is provided with a central opening 90 through which the depending tubular shaft 16, and, thus, the susceptor supporting drive shaft assembly 22, axially extend. Due to the depending tubular shaft 16 and the drive shaft assembly 22, there will be some inherent heat losses at the center of the susceptor 20. To compensate for this heat loss and to provide temperature control, the above-mentioned radiant heat concentrator 36 is provided.

The heat concentrator 36 preferably includes four identical heat focusing devices 92, 94, 96 and 98 which are located in equally spaced relationship with respect to each other about the vertical axis defined by the central opening 90 of the lower housing 66 and the tubular shaft 16. Each of the heat focusing devices 92, 94, 96 and 98 is suitably attached to the bottom wall 68 of the lower housing 66.

Figure 4:
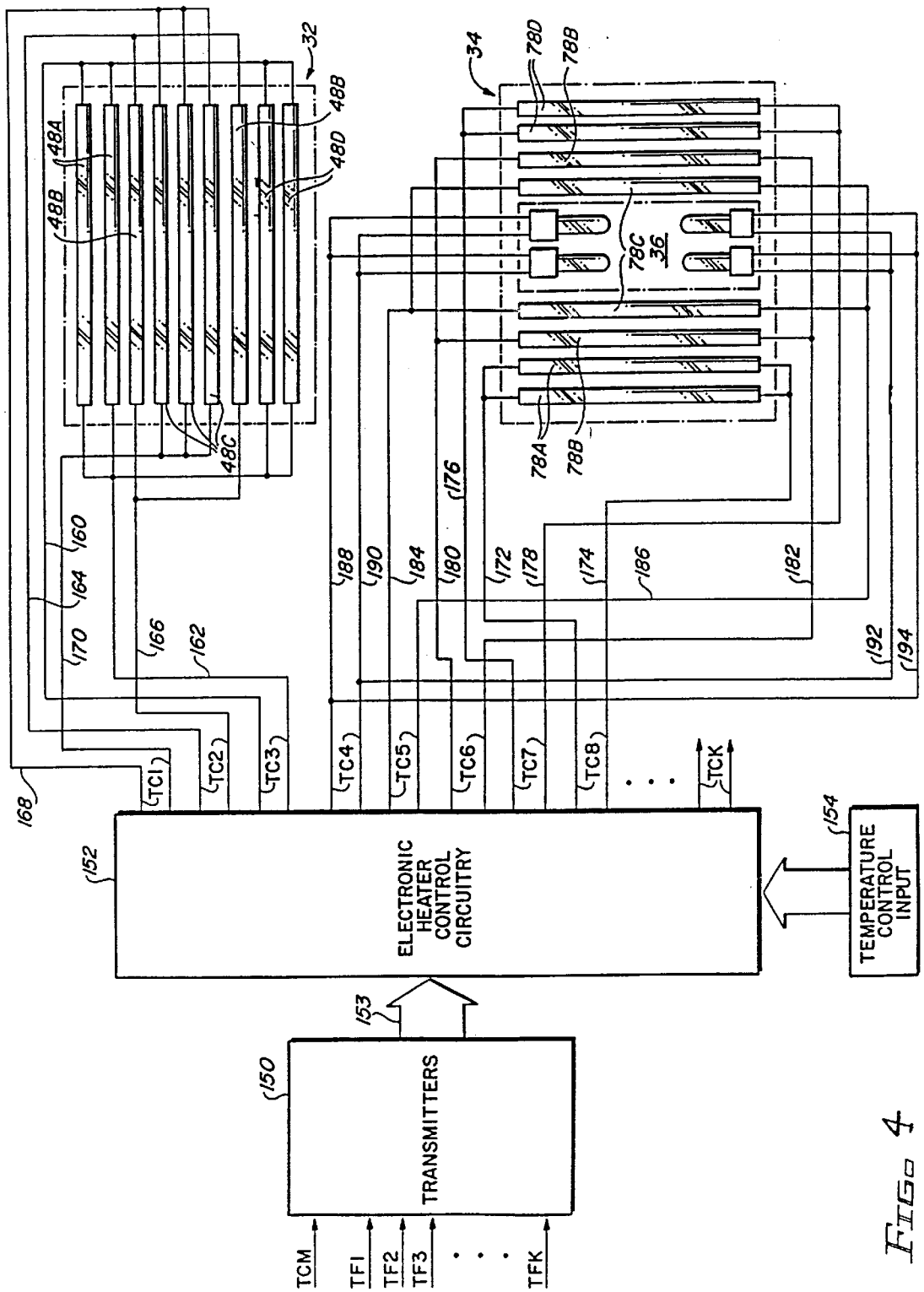
FIG. 4 is a diagrammatic view of the heating system of the present invention and also shows electrical connection to a suitable control circuit means.

Referring to FIG. 4, the master heat sensor 24 and the temperature follower, or slave, heat sensors 28, 29 and 30, sense the temperatures at various zones in and around the susceptor 20 and the ring 26, and produce signals indicative of those sensed temperatures. The signals from the master temperature sensor 24 are directed to suitable transmitter circuitry shown as block 150 as indicated at TCM in FIG. 4. Similarly, the temperature sensors 28, 29 and 30, which may vary in number as desired or needed, as supplied as inputs TF1, TF2, TF3, . . . TFK, to the transmitter circuitry of block 150. The transmitter circuitry of block 150 contains suitable well known components and circuits, such as amplifiers (not shown), for transmitting the temperature indicative signals to an electronic heater control 152 as indicated by the data transfer arrow 153.

The electronic heater control which is shown in the form of the block 152, may include any conventional type of master-slave heater control circuitry as is well known in the art, which would typically include a power supply, a plurality of lamp driver circuits, and a plurality of differential amplifiers with selectively alterable offset controls.

Temperature control information, such as data indicating the starting and finishing of a vapor deposition cycle, the desired operating temperature at which the deposition is to be accomplished and the like may be supplied to the electronic heater control of block 152 from a temperature control means shown in the form of block 154.

The electronic heater control of block 152 receives data from the temperature control means 154 and the signals from the temperature sensors 24, 28, 29 and 30 and generates a plurality of control signals which appropriately provide additional power or remove power from the upper and lower heating element assemblies 32 and 34, and the concentrator means 36 for precise control of heating of the susceptor.

In that the various temperature sensors 24, 28, 29 and 30 sense temperatures in various zones in the reaction chamber 10, the radiant heat input of the upper and lower heating element assemblies 32 and 34, and the heat concentrator means 36, are preferably connected and operated in a manner which provides individually controllable zones of radiant heating energy input.

As seen in FIG. 4, the four elongated tube-type radiant heating elements 48A and 48D of the upper heating element assembly 32 have their opposite end terminals ganged together by conductors 160 and 162 so that they are operated as an entity by control signals TC-3 produced by the heater control 152. Thus, the four elements 48A and 48D provide two physically spaced apart commonly controlled heating zones which are disposed proximate the opposite sidewalls of the reaction chamber 10 with the zones extending parallel to the reactant gas flow path to provide heating of the opposed lateral edges of the temperature sensing ring 26 and the susceptor 20. The two elongated tube-type radiant heating elements 48B have their opposite end terminals ganged together by conductors 164 and 166 and are thus controlled as an entity by the output signals TC-2 from the heater control 152. Therefore, the two elements 48B provide two more physically separated heating zones which are controlled as a single entity with these zones extending in parallel relationship with the reactant gas flow path and being disposed between the zones established by the elements 48A and 48B and on opposite sides of the center of the susceptor 20. The three elongated tube-type radiant heating elements 48C are also connected to operate as a single entity by having their end terminals connected in a ganged manner by conductors 168 and 170 so that the control signals TC-1 produced by the heater control 152 will operate those elements. These centrally located heating elements 48C provide a single central zone of radiant heating energy input which extends across the temperature sensor ring 26 and the susceptor 20 in an extending path which is parallel to the reactant gas flow path through the reaction chamber 10.

The lower heating element assembly 34 has the end terminals of the two elongated tube-type radiant heating elements 78A thereof ganged together by conductors 172 and 174 so that they operate as a single entity under control of the output signals TC-7 of the heater control 152. Thus, the two elements 78A provide a single individually controllable zone of radiant heat energy input which extends transversely of the reaction chamber below the leading edges of the temperature sensor ring 26 and the susceptor 20. Similarly, the two elongated tube-type radiant heating elements 78D have their end terminals ganged together by the conductors 176 and 178 so as to operate as an entity under control of the output signals TC-7 of the heater control 152. Therefore, the two elements 78D provide a signal individually controllable zinc of radiant heat energy input which extends transversely across the reaction chamber 10 below the trailing edges of the temperature sensing ring 26 and the susceptor 20. The leading edges of the ring 26 and the susceptor 20 are herein defined as those edges which are upstream in the reactant gas flow path and the trailing edges are those which are downstream in the reactant gas flow path.

The two elongated tube-type heating elements 78B of the lower heating element assembly 34 have their end terminals ganged together by means of the conductors 180 and 182 so that they are operably controlled as an entity by the output signals TC-6 of the heater control 152. Therefore, the two elements 78B provide two spaced apart transversely extending heating zones which are controlled in unison, with one of those zones being adjacent and immediately downstream of the leading edges of the temperature sensor ring 26 and the susceptor 20, and other zone being immediately upstream of trailing edges thereof. Similarly, the two elongated tube-type radiant heating elements 78C have their end terminals ganged together by conductors 184 and 186 and are thus controlled as a single entity by the output signals TC-5 of the heater control 152. Therefore, the two heating elements 78C provide two physically spaced apart transversely extending heating zones which are commonly controlled and are disposed on opposite sides of the center of the susceptor 20.

The bulb-type radiant heating elements 126 of the heat concentrator means 36 have their respective terminals gang coupled by conductors 188, 190, 192 and 194 which are in turn coupled to receive the temperature control output signals TC-4 from the heater control 152. Thus, each of the radiant heat focusing devices 92, 94, 96 and 98 operate in unison to provide a concentrated heat energy receiving zone at the center area of the susceptor 20.

When an input signal is received from the temperature control input means 154 to indicate the start of a deposition cycle, the heater control means 152 responds by applying full power to the heat focusing devices 92, 94, 96 and 98 of the heat concentrator means 36, to the heating elements 48B, 48C of the upper heating assembly 32 and to the heating elements 78B, 78C of the lower heating assembly 34. That same input signal contains information indicative of a desired operating temperature at which the deposition cycle is to be accomplished. The application of full power to the heat concentrator means 36 and to the selected heating elements of the heating assemblies 32 and 34 produces a rapid rise in the temperature in the central area of the susceptor 20, and of course, in the central area of the substrate 19 being processed. The master temperature sensor 24 senses the rapid rise in temperature and sends signals indicative thereof to the heater control means 152 which compares the sensed temperature with the desired operating temperature and adjusts the power supplied to the concentrator means 36 and the selected heating elements of the heating assemblies 32 and 34 to produce and maintain the desired operating temperature in the central area of the susceptor 20 and substrate 19.

The sensed temperature signals produced by the master temperature sensor 24 are also used simultaneously by the heater control means 152 to apply power to the other elongated tube-type radiant heating elements 48A, 48D, 78A and 78D of the upper and lower heating element assemblies 32 and 34, respectively. Thus, while the temperature in the central areas of the susceptor 20 and the substrate 19 are being brought up to the desired operating temperature, the temperatures about the periphery of the susceptor and the ring 26 are simultaneously being brought up to the temperature by the heating elements 48A, 48D, 78A and 78D of the upper and lower heating element assemblies 32 and 34 in what may be described as a following operation. The increasing temperatures in the peripherally located heating zones or regions are sensed by the slave temperature sensors 28, 29 and 30, and additional sensors if desired, and the slave temperature sensors produce signals indicative of the sensed temperatures. The signals received by the heater control means 152 from the slave temperature sensors 28, 29 and 30, are compared with the signal received from the master temperature sensor 24 to adjust the power to the elongated tube-type heating elements 48A, 48D, 78A and 78D to bring the temperatures in the peripherally located heating zones into alignment with the temperature in the central area of the susceptor 20 and the substrate 19.

Due to variables, such as heat losses at the peripheral edges of the substrate 19 and the susceptor 20, the flow of reactant gas through the reaction chamber 10, and the like, the heating elements 49A, 48D, 78A and 78D may be ideally set to normally operate at temperatures which are offset, i.e., different from the desired operating temperature in the central area of the substrate 19 and the susceptor 20. And, the process of sensing temperatures and adjusting the power applied to the various groups, or banks of heating elements as needed, is continued through the deposition cycle. The object of all this is, of course, to provide a uniform, or flat temperature gradient in all of the relevant areas of the substrate, susceptor and temperature sensing ring throughout the deposition cycles. And, in the interests of production time, to bring the system up to temperature as fast as possible at the beginning of a cycle and cool it down when a cycle is completed. The rapid increasing of temperatures at the beginning of a cycle, as described above, is accomplished by the concentrator 36 and selected heating elements of the heating assemblies 32 and 34 in combination with the master-slave temperature sensor arrangement which effectively produced the temperature following mode of operation. Cooling the system down at the end of a cycle is accomplished by reversing the above heating-up procedure. In other words, the power applied to the concentrator means 36 and the selected heating elements proximate the center of the heating assemblies 32 and 34 is reduced and the temperature in the peripherally located heating zones will follow along with the reduction of heat at the center areas of the substrate 19 and the susceptor 20.

Figure 5:
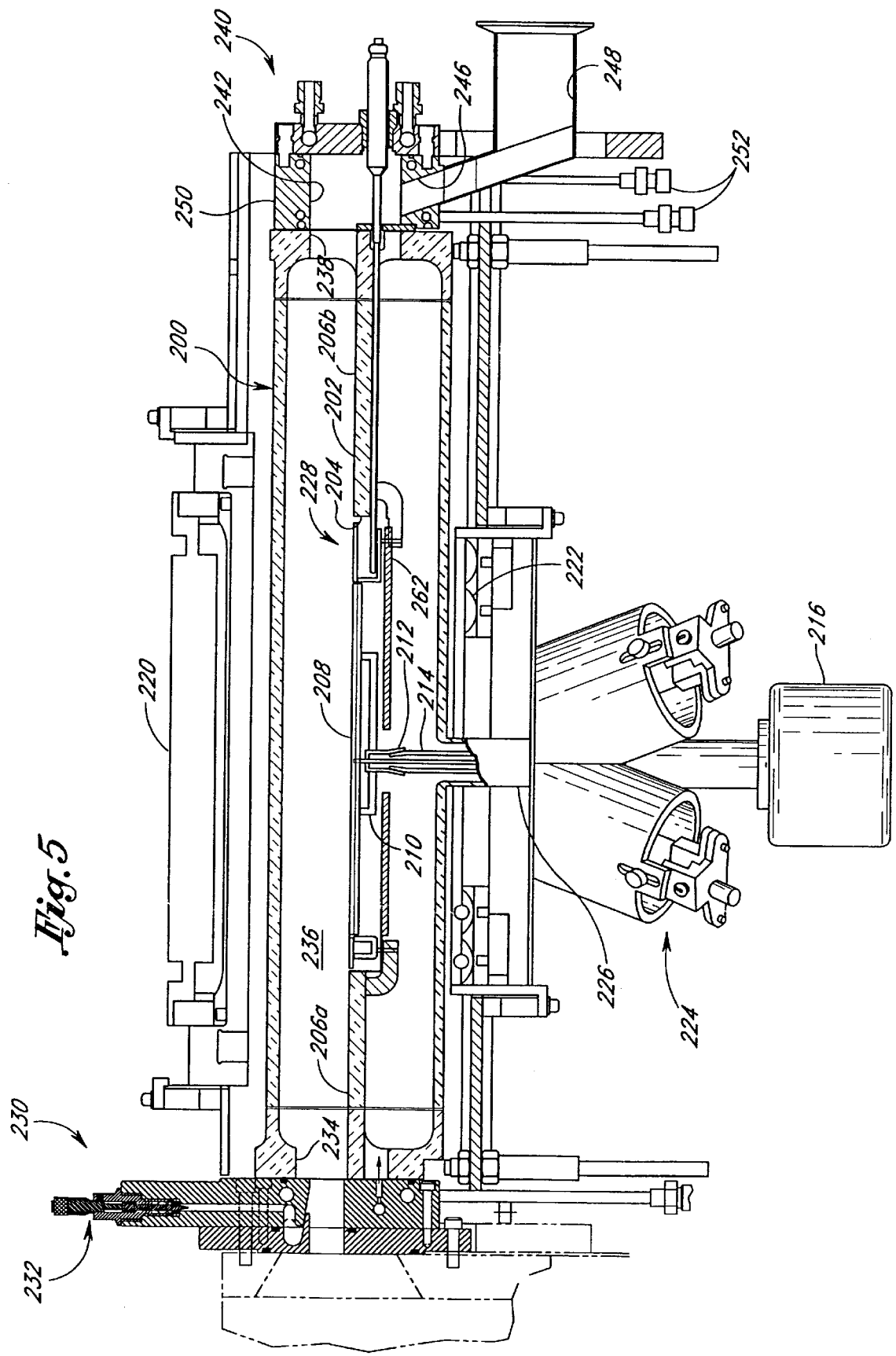
FIG. 5 is a cross-sectional view illustrating one embodiment of a processing system environment which may be optimized by the method of the present invention.

FIG. 5 illustrates a particularly successful arrangement of components surrounding a lenticular cross-section quartz reaction chamber 200 to produce highly uniform chemical vapor deposition. The chamber 200 includes a central inner quartz support plate 202 having an aperture 204 formed therein sized to receive a susceptor for supporting a semiconductor wafer. The support plate 202 is divided into a front section 206a upstream of the aperture 204 and a rear section 206b downstream of the aperture 204. A susceptor 208 is positioned on a plurality of radially extending arms 210 of a central hub 212 mounted on a hollow shaft 214. The shaft 214 is, in turn, rotated by a motor 216 disposed below the chamber 200. The rotational coupling between the motor 216 and shaft 214 is described in U.S. Pat. No. 4,821,674. The motor 216 is preferably mounted on a fixed frame and includes adjustment mechanisms for positioning the susceptor 208 within the chamber 200.

The susceptor 208 supports a wafer (not shown) thereon for chemical vapor deposition or other processing. A plurality of radiant heat lamps are arranged around the reaction chamber 200 to heat the susceptor 208 and wafer thereon. A first bank of upper lamps 220 extends longitudinally with respect to the chamber 200. A second lower bank of lamps 222 extends laterally with respect to the chamber 200. The distribution of the upper bank of lamps 220 is unimpeded so that a regular sequence of lamps is provided across the lateral extent of the chamber 200. The lower bank of lamps 220, on the other hand, is provided on both sides of the shaft 214, but is discontinued in the region surrounding the shaft.

One or more spot lights or directed lamps 224 are positioned under the chamber 200 and surrounding a downwardly depending quartz tube 226 formed integrally with the chamber 200. The tube 226 concentrically receives the shaft 214. The tube 226 and shaft 214 create an annular space therebetween which is used to inject a purge gas into a region underneath the susceptor 208. The directed lamps 224 radiate energy to the underside of the susceptor 208, which may be shadowed by the shaft 214 and supporting structure. The specific heating arrangement is similar to that described and illustrated in U.S. Pat. No. 4,836,138, which is hereby expressly incorporated by reference.

The upper and lower banks of lamps 220, 222 are distributed in a generally rectangular configuration above and below, respectively, the susceptor region 208. This arrangement, in combination with the directed lamps 224, focuses the radiant energy on the susceptor 208 and the associated wafer. In addition, the perpendicular orientation of the upper and lower banks 220, 222 further enhances uniformity of heating of the susceptor 208. An enlarged temperature compensation ring 228 is shown in FIG. 5, and its specific structure will be described in more detail below. It should be noted, however, that the peripheral shape of the modified temperature compensation ring 228 is generally rectangular and conforms to the projected columns of radiant heat from the upper and lower banks of lamps 220, 222. This arrangement is highly efficient and results in more uniform temperature across the susceptor 208.

A gas injector 230 is positioned upstream of the process chamber 200 and includes a plurality of reactant gas flow needle valves 232 for metering the reactant gas into the chamber through multiple ports. Reactant gas is metered through the injector 230 and thereafter passes through an inlet aperture 234 leading into an upper region 236 of the process chamber 200. The gas flows across the susceptor 208 and wafer, above the inner support plate 202, and exits through an outlet aperture 238 in the process chamber 200.

FIG. 5 illustrates a modified exhaust apparatus 240 which receives both the spent reactant gas flow and any purge gas flow. More particularly, a plenum chamber 242 receives the aforementioned gas flows and leads to an angled exhaust conduit 246 in communication with an exhaust manifold 248. The exhaust manifold 248 is attached to a suitable source of vacuum. The plenum chamber 242 is defined by a generally rectangular flange member 250 which is preferably water cooled with internal passages supplied with cooling fluid through pipes 252. Internal cooling of the flange member 250 helps prevent deterioration of elastomeric seals between the flange member and the process chamber 200.

FIGS. 5 and 6 illustrate the aforementioned modified temperature compensation ring 228 surrounding the susceptor 208. The ring 228 is built outward to conform closely to the rounded rectangular aperture 204 formed in the support plate 202 of the chamber 200, but is spaced therefrom to avoid degradation of the quartz support plate 202. In one particular embodiment, as seen in FIG. 6a, the modified temperature compensation ring 228 comprises a lower annular U-shaped channel member 256, and an upper planar member 258. The upper member 258 includes an opening which is centered over the channel member 256 through the use of one or more integrally formed downwardly depending centering rings 260, which can also be small projections spaced in a circular pattern. The lower member 256 supports a plurality of elongated of thermocouples which, as previously described, extend from a downstream end of the chamber 200 into the ring 228. The ring 228 includes openings in its downstream end for receiving the thermocouples.

There are preferably three thermocouples supported by the temperature compensation ring 228, all of which enter the chamber from the downstream end. The three thermocouples extend in parallel forward into the chamber underneath the support plate 202 and are spaced apart in the lateral direction. A middle thermocouple extends just underneath the support plate 202 and terminates downstream of the susceptor 208. A second thermocouple enters the ring 228 and curls around a circular path defined by the channel member 256 to terminate at the leading edge of the ring. A third thermocouple also enters the ring 228 and curls halfway around the channel member 256 in the opposite direction from the second thermocouple to terminate at a position midway between the leading and trailing edges of the susceptor 208. The combination of the three thermocouples thus senses temperature at the leading edge, trailing edge, and one side edge of the susceptor 208.

To enable the thermocouples to enter the channel member 256, its rear end is formed by an elongated L-shaped portion. This portion is absent an exterior wall to allow the thermocouples access to the interior of the channel. Although not shown, the L-shaped portion may extend around an arc sufficient in length to receive the three entering thermocouples, or may comprise discrete portions at the locations through which each thermocouple passes into the channel member 256.

The upper planar portion 258 has an inner edge which is sized approximately the same diameter as the inner wall of the channel portion 256 and closely conforms to but is spaced from the outer peripheral edge of the susceptor 208. An outer edge of the planar member 258 extends outwardly from the outer wall of the channel member 256 and conforms closely with the rounded rectangular aperture 204. Again, the ring 228 is preferably constructed of graphite having a large thermal mass to help insure temperature uniformity across the susceptor 208 and wafer. In alternative embodiments, however, the ring 228 may be constructed of a lower thermal mass, or even of quartz so that direct radiant heat from the banks of lamps 220, 222 and 224 can impinge on the edge of the susceptor 208.

The process chamber 200 of FIG. 5 further incorporates a sacrificial quartz plate 262 to protect the upstream edge of the aperture 204. As seen in FIG. 6, the sacrificial quartz plate 262 comprises a horizontal planar portion 264 and a vertical curvilinear lip 266. The horizontal portion 264 further includes a large central aperture 268 which is sized to receive the drive shaft 214 and hub 212. The horizontal portion 264 extends underneath the susceptor 208 and is supported by three fingers 270 depending from below the central support plate 202. A front finger 270a is centrally disposed across the lateral width of the upstream section 206a of the central support plate 202. A pair of downstream fingers 270b are spaced laterally from the center of the support plate in its downstream section 206b. The approximate location of these fingers are best seen in the exploded view of FIG. 6.

FIG. 7 illustrates a CVD parallel flow process chamber 280, similar to the process chamber 200 shown in FIG. 5, having a susceptor 282 for supporting wafers in a process gas flow. As before, process gases enter through an inlet 284 and exit through an exhaust 286 in the chamber, flowing in a direction parallel to the plane of the susceptor. Upper and lower banks of radiant heat lamps 288a, 288b are positioned adjacent the chamber. It will be noted that the banks of lamps 288a,b extend farther downstream than the banks of lamps described for the embodiment of FIG. 5. Other arrangement of heat lamps may be used. As described previously, the individual lamps in each bank may be controlled to vary the temperature of the wafer.

The chamber embodiment in FIG. 7 introduces a downstream structure in the chamber which elevates the temperature of the process chamber wall downstream of the wafer and the susceptor, improving the etching efficiency of the chamber. A temperature compensation ring 290 is provided surrounding the susceptor 282. In contrast to the ring 228 of FIG. 5, which extended downstream only to the edge of the rounded rectangular aperture 204 of the support plate 202, a top plate 292 of the ring 290 extends substantially farther. To accommodate this extension, a support plate 294 in the chamber 280 includes a susceptor aperture having a downstream edge 296 which, at a centerline of the chamber, is approximately one half of the way between the susceptor 282 and an exhaust 298.

The downstream structure shown and described above may also be useful in process chambers other than the lenticular chamber having an inner support. For example, FIG. 8 illustrates a process chamber 300 having an entry region 302 and an exit region 304, the two regions being rectangular in cross-section. The entry region 302 is defined by a horizontal upper wall 306 and a horizontal first lower wall 308 terminating at a vertical step 310. The step 310 forms the beginning of a second lower wall 312 of the exit region 304 which shares the upper wall 306 with the entry region 302. The chamber 300 thus has a cross-sectional area which approximately doubles at the step 310. A susceptor 314 is supported by a rotary shaft 316 just downstream of the step 310 and in a plane approximately level with the first lower wall 308. A temperature compensation ring 318 supported by a ring-like stand 320 above the second lower wall 312 closely surrounds the susceptor, as previously described. The stand 320 may be as shown and described in U.S. Pat. No. 4,821,674.

A plate 322 is positioned downstream from the ring 318 and may be supported on a stand on the second lower wall 312, or by pins or dowels 324 supported by the side walls of the chamber 300. As seen, the plate 322 is approximately in the plane of the ring 318, susceptor 314, and wafer supported thereon, and extends from the ring to close to the chamber outlet. Upper and lower banks 326a, 326b of lamps direct radiant energy into the chamber and are arranged substantially above and below the area stretching from the leading edge of the ring 318 to the trailing edge of plate 322. The gas flow through the chamber is indicated with the arrow 328. The downstream plate 322 is preferably constructed of graphite to realize the aforementioned benefits of more efficient chamber etch and better temperature uniformity over the wafer. The plate 322 may also be quartz which will not affect the temperature distribution within the chamber significantly, but will enhance flow characteristics and reduce recirculations.

FIG. 9 shows the same chamber 300 with a modified temperature compensation ring 332 surrounding the susceptor 314. The ring 332 comprises a lower annular U-shaped member 334 topped by a planar member 336 which has a width around the susceptor approximately equal to the U-shaped member, but which extends substantially downstream into the exit region 304. The ring 332 is in many respects similar to the ring 290 shown in FIG. 7. In contrast to the previous ring 290, which was supported by fingers attached to the inner support plate 294, the ring 332 is partially supported by the stand 320 and partially by a downstream strut 338. Of course, there are many ways to position the ring 332 in the chamber, the preferred means including some type of quartz structure which can be easily replaced after it deteriorates from repeated process cycles. Again, the ring 332 is desirably constructed of a material with a high thermal mass to help maintain temperature uniformity over the wafer and to enhance the etch cycle effectiveness.

II. Wafer Monitor Method

The criteria of uniformity in wafer processing are critically related to temperature. Many wafer processing operations, such as oxidation, nitridation, diffusion, epitaxy, annealing, passivation and CVD, involve heating a semiconductor wafer to form layers of different materials for later patterning and interconnection to produce the circuitry defining a microelectronic device. A single wafer generally includes a plurality of identical microelectronic devices, such as a microprocessor or a dynamic random access memory, distributed in a pattern across its top surface. Because the microelectronic devices at various locations across the wafer surface are identical, it is critical to form each layer comprising a microelectronic device in a manner that provides uniform layer properties in every location on the wafer surface.

Many of the layers comprising a microelectronic device are formed by chemical reactions. To understand the kinetics of a chemical reaction, one may express the reaction rate R for a chemical reaction A→B as follows:

$$R = k_0 e^{\frac{-E}{R_G T_S}} C_A^n$$

where $C_A$ denotes the concentration of reactive species A, n denotes the reaction order, $k_0$ is the Arrhenius coefficient, $R_G$ is the gas constant, E is the activation energy and $T_S$ is the wafer surface temperature. For steady state operation, the surface temperature $T_S$ and the concentrations of reacting species, such as $C_A$, do not vary with time, so the reaction rate R is similarly invariant with time. However, as discussed above, the surface temperature $T_S$ often varies with location across the wafer surface. As indicated by the reaction rate equation, a small variation in surface temperature $T_S$ may cause a large variation in reaction rate R due to the exponential relationship between reaction rate R and surface temperature $T_S$. Thus, even at steady state, there are variations in the reaction rate R across the wafer surface resulting from variations in the surface temperature $T_S$.

The present invention utilizes these variations in reaction rate across the wafer surface to determine the corresponding variations in surface temperature across the wafer. To do so, a layer is formed on a stationary monitor wafer by a chemical reaction at predetermined processing conditions. The variations in the layer formation rate manifest themselves as thickness variations in the formed layer. For example, if the layer formation rate is 100 Angstroms per minute in a first surface location and 110 Angstroms per minute in a second surface location, after five minutes, the second surface location is 50 Angstroms thicker than the first location. In this manner, the formation of a layer converts surface temperature variations into corresponding thickness variations. In a preferred embodiment, to determine the thickness variations across the monitor wafer surface in the formed layer, color transitions across the monitor wafer surface due to corresponding thickness variations are noted. The color transitions across the monitor wafer are then empirically correlated to surface temperature differences to enable wafer heating adjustments to reduce surface temperature variations.

It is well known in the art that a transparent thin film exhibits color variations when observed from certain angles under certain lighting conditions. For example, as disclosed in *IBM J. Res. & Dev.*, 8, 43 (1964), FIG. 10 shows a color chart for silicon dioxide films illustrating the correspondence between film thickness and color when observed perpendicularly under daylight fluorescent lighting. The film thickness corresponding to a particular color varies with the material comprising the film. For example, to obtain thicknesses for a silicon nitride layer using the color chart for silicon dioxide, the thickness value in FIG. 10 corresponding to the color observed for the silicon nitride film is multiplied by 0.75. The observed color of the film layer results from interference of light reflected from the top surface of the film layer and light reflecting off the bottom surface after refracting at the top surface and traversing the film layer. Color variations result from a layer having transparency to selected wavelengths of visible light used for observation. For example, layers may be formed of silicon dioxide, silicon nitride, polysilicon, borophosphosilicate glasses (BPSG), certain polymers and other dielectric materials. Generally, the layer is of a thickness sufficient to permit light transmission through the layer for reflection of the light off the bottom surface. Similarly, a stack of multiple transparent layers of selected thicknesses may also be used. Here, the color variations result from interference of reflected and refracted light at each of the surfaces comprising interfaces between each of the layers.

To prepare a color chart useful for practicing the present invention, a layer material having transparency for the thicknesses of interest is selected such that the reactant materials and carrier gases used to form the layer and any by products are compatible with the subsequent use of the thermal reactor. For example, in a silicon epitaxy reactor, a layer of polysilicon is used because the reactant materials and carrier gas, silane and hydrogren, produce a layer of polycrystalline silicon and hydrogen gas. The silane, hydrogen and polysilicon do not adversely affect subsequent operation of the silicon epitaxy reactor and no reactor cleaning or other preparation is required after formation of the polysilicon layer for temperature adjustments. Upon selection of an appropriate layer material, several monitor wafers having layers with regions of known thicknesses are prepared. Preparation of these monitor wafers having layers with regions of known thicknesses may occur in the thermal reactor requiring adjustments or in another reactor when it is not convenient or when the thermal reactor is not properly configured. The color corresponding to the region of a layer of known thickness is noted and a chart summarizing the color-thickness relationships is prepared. In addition, the known layer thicknesses can be correlated to temperature differences using the rate equation where all remaining formation conditions, such as time, concentration of the reactant materials, carrier gas flowrate and reaction pressure, are assumed to be constant. The calculated temperature differences corresponding to selected thicknesses are then added to the color chart. Lastly, recommended adjustments to the thermal reactor, such as power to a heating lamp or changes in thermocouple or pyrometer setpoints, to compensate for a known temperature difference are added to the color chart 350 as shown in FIG. 11.

The conversion of surface temperature variation to layer thickness variation enables the use of color to make wafer heating adjustments. The use of color simplifies and expedites the preparation of the thermal reactor for wafer manufacturing operations. In contrast to the complexity of existing techniques, the preparation of the thermal reactor is reduced to depositing a layer, observing the color transitions of the deposited layer and consulting a reference indicating the wafer heating adjustments corresponding to the color transitions. In addition, the use of color reduces the time needed to prepare a thermal reactor for manufacturing operation. In about fifteen minutes, a manufacturing operator can deposit the layer, note the color transitions and make the necessary adjustments to compensate for surface temperature differences. Moreover, the method of the present invention permits the manufacturing operator to confirm the effectiveness of wafer heating adjustments by depositing a layer on a second monitor wafer after completing adjustments from the first monitor wafer. As noted above, deposition and adjustments for the confirmatory monitor wafer incur only an additional fifteen minutes, so the entire procedure including a monitor wafer is complete in about half an hour.

To deposit the layer, a silicon monitor wafer having an oxide layer is placed in the susceptor of the thermal reactor where the stationary monitor wafer is heated to a predetermined temperature at a predetermined pressure. Note that any silicon wafer having an oxide top layer may be used for a monitor wafer. Thus, a semiconductor manufacturer can use scrap wafers as substrates on which to form a top layer oxide for use as a monitor wafer to practice the present invention. In a preferred embodiment, the monitor wafer comprises a 200 mm silicon wafer having an oxide layer of about 1000 Angstroms thickness heated to about 700 deg C at a pressure of 40 torr. In another preferred embodiment, the monitor wafer comprises a 150 mm silicon wafer. In yet another preferred embodiment, the monitor wafer comprises a 300 mm silicon wafer. In yet another preferred embodiment, the monitor wafer is heated at atmospheric pressure. When the monitor wafer reaches the predetermined temperature, hydrogen gas and 2% silane is flowed into the thermal reactor for a selected time. In a preferred embodiment, the hydrogen gas is flowed at about 25 standard liters per minute and the 2% silane (ULSI grade) gas is flowed at about 3.3 standard liters per minute for about 5 minutes so as to form a polysilicon monitor layer of about 500 Angstrom thickness above the oxide layer on the monitor wafer. The polysilicon monitor layer generally exhibits a gold color for the 500 Angstrom target thickness in addition to a pink color for thicker regions corresponding to higher surface temperatures and a blue color for thinner regions corresponding to lower surface temperatures as shown in the color chart 350. Note that any combination of temperature, pressure, time and gas flowrates to produce the equivalent concentration of hydrogen and silane to form a polysilicon monitor layer of about 500 Angstrom thickness above the oxide layer on a stationary monitor wafer is sufficient to practice the invention. Lastly, note that the monitor wafer having a polysilicon monitor layer can be reused by removing the polysilicon monitor layer, such as by a silicon etch that terminates at the top surface of the oxide layer.

In another preferred embodiment, a silicon monitor wafer having an oxide layer of about 1000 Angstroms and having an amorphous silicon or polysilicon seed layer of about 200 to 400 Angstroms thickness is placed in the susceptor of the thermal reactor where the stationary monitor wafer is heated to a predetermined temperature at a predetermined pressure. In a preferred embodiment, the monitor wafer comprises a 200 mm silicon wafer heated to about 875 deg C at about atmospheric pressure. In another preferred embodiment, the monitor wafer comprises a 150 mm silicon wafer. In yet another preferred embodiment, the monitor wafer comprises a 300 mm silicon wafer. In yet another preferred embodiment, the monitor wafer is heated at atmospheric pressure. When the monitor wafer reaches the predetermined temperature, hydrogen gas and SiHCl₃ gas is flowed into the thermal reactor for a selected time. In a preferred embodiment, the hydrogen gas is flowed at about 25 standard liters per minute and the SiHCl₃ gas is flowed at about 0.5 grains per minute in a hydrogen carrier gas for about 40 seconds so as to form a polysilicon monitor layer of about 400 Angstrom thickness in addition to the thickness of the amorphous or polysilicon seed layer, on the monitor wafer. The polysilicon layer generally exhibits a pink color for the 400 Angstrom target thickness in addition to a blue color for thicker regions corresponding to higher surface temperatures and a gold color for thinner regions corresponding to lower surface temperatures. Note that any combination of temperature, pressure, time and gas flowrates to produce the equivalent concentration of hydrogen and SiHCl₃ to form a polysilicon monitor layer of about Angstrom thickness above the oxide layer on a stationary monitor wafer is sufficient to practice the invention.

Figure 12:
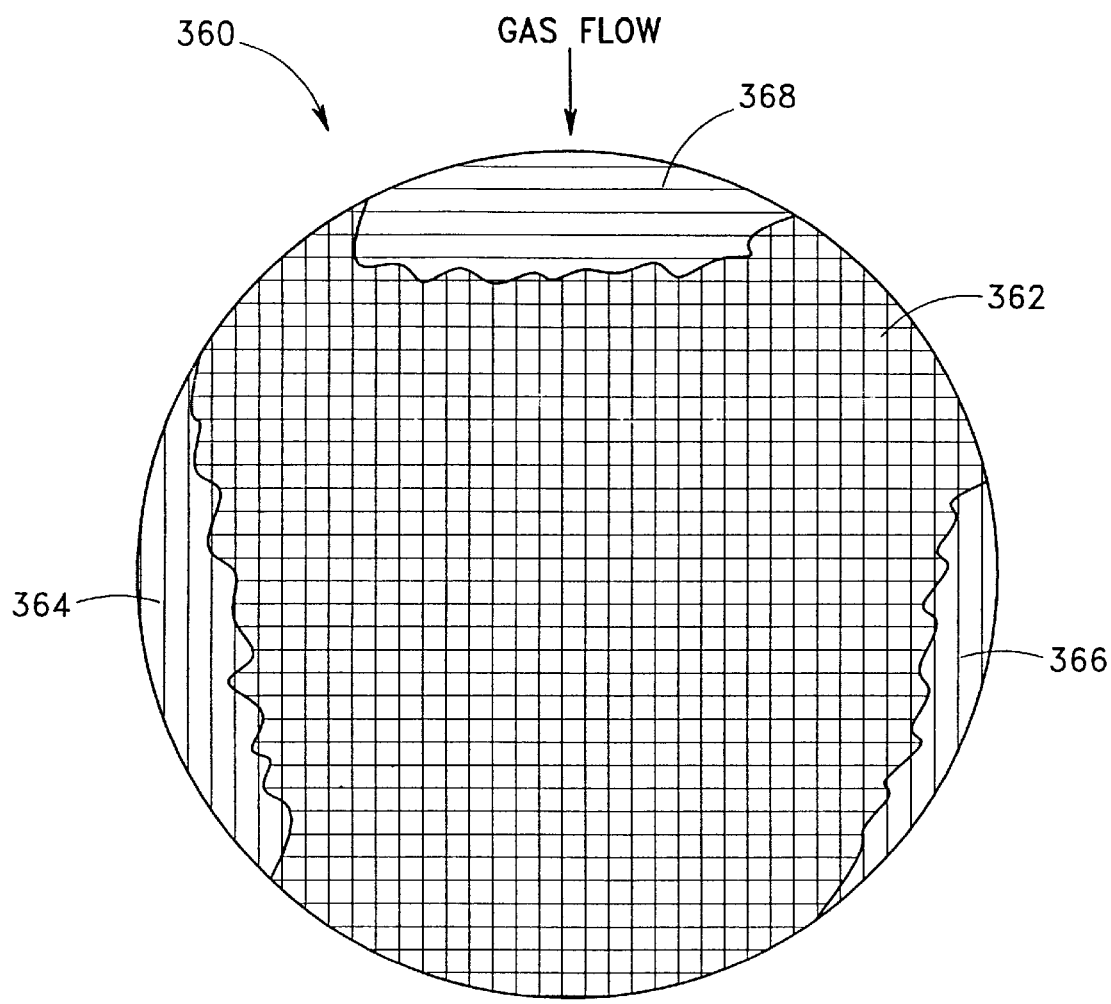
FIG. 12 is a plan view of a polysilicon monitor layer of a monitor wafer illustrating several regions having color variations corresponding to thickness variations of the polysilicon monitor layer.

For example, FIG. 12 shows a top view of a monitor wafer 360 illustrating color variations of a polysilicon monitor layer formed according to the processes described above for a thermal reactor of FIG. 1. The monitor layer includes a uniform region 362, having a gold color when observed from a direction 30° to 60° from the horizontal edge of the wafer under fluorescent or day light lighting conditions, indicative of the monitor layer target thickness. The monitor layer likewise includes a first edge region 364 and a second edge region 366, each having a red color indicative of a thickness in excess of the target thickness, at the outer edges of the monitor wafer 360. Similarly, at the location where the gases to form the monitor layer first contact the monitor wafer 360, the monitor layer has a top region 368, having a blue color indicative of a thickness below the target thickness. In analyzing the monitor wafer 360, a maintenance technician first notes that the monitor wafer includes a substantial portion of uniform target thickness 362 as indicated by the gold color. Thus, no thermal reactor adjustments are indicated for the uniform region 362. However, the maintenance technician also notes that the two medge regions 364, 366 have a pink color indicative of a thickness in excess of the target thickness. For these regions, the color chart 350 (FIG. 11) indicates that a decrease of 8 deg C in the offset to each of the thermocouples located in the susceptor adjacent to an edge region 364, 366 is required. Similarly, the maintenance technician notes that the blue color of the top region 358 indicates an increase of 15 deg C in the offset of the adjacent thermocouple in the susceptor.

Figure 13:
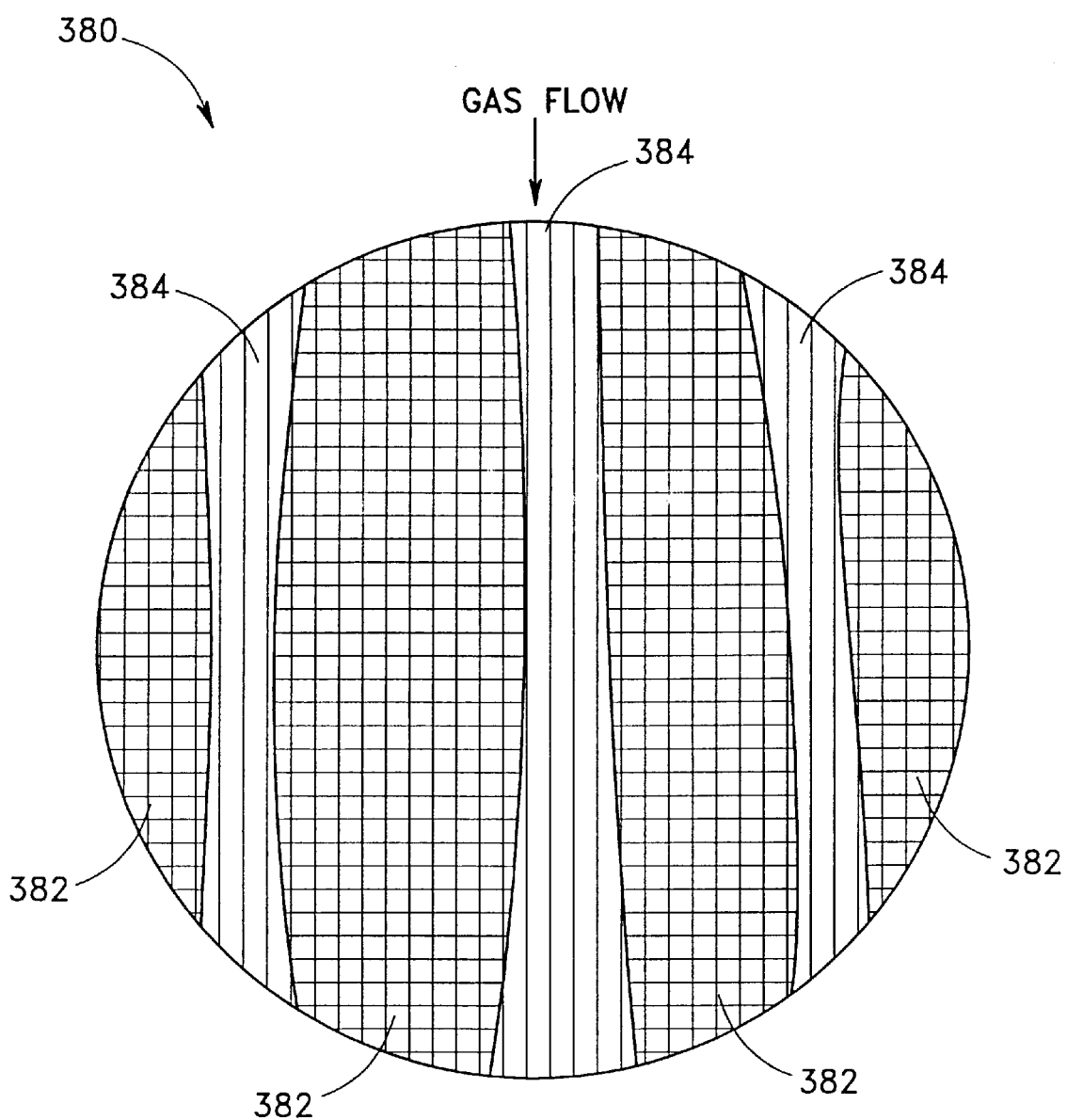
FIG. 13 is a plan view of another polysilicon monitor layer of a monitor wafer illustrating striped regions having color variations corresponding to thickness variations of the polysilicon monitor layer.

Referring now to FIG. 13, a top view of a monitor wafer 380 illustrates alternating striped color regions of a polysilicon monitor layer formed according to the processes described above for a thermal reactor of FIG. 1. The monitor wafer 380 includes target regions 382, having a gold color indicative of the desired target thickness, and offset regions 384, having a pink color indicative of thickness in excess of the desired target thickness. In this situation, a maintenance technician notes that a striped pattern involving offset regions 384 having a pink color indicates an adjustment of the entire lamp array above the susceptor about ½ inch away from the susceptor. Note that the color chart 350 (FIG. 11) may be supplemented to include these types of adjustments. After the maintenance technician adjusts the lamp array, another polysilicon monitor layer may be grown on a second monitor wafer to confirm that the adjustment has eliminated color variations, and therefore temperature variations, across the surface of the wafer. If so, the thermal reactor is released to manufacturing for subsequent processing of production wafers.

III. Summary

The present invention advantageously overcomes several limitations of existing technologies and alternatives. Use of the present invention eliminates the need to employ trial and error methods that result in substantial down time of the thermal reactor. Semiconductor manufacturers can thus recover this substantial down time to process production wafers. Similarly, the present invention eliminates the need to procure expensive instrumented wafers and to reconfigure the thermal reactor to receive the instrumented wafer to obtain a thermal profile. The present invention likewise eliminates the risk of introducing incompatible metal wiring into the thermal reactor to use the instrumented wafer. Here again, the present invention recovers the down time associated with reactor reconfiguration, instrumented wafer installation, temperature data recovery and complex data analysis and reactor cleaning for production use. In addition, the present invention eliminates any concern regarding the reliability of temperature sensors and their measurements. Lastly, the present invention provides great flexibility in its use. For example, the present invention is useful after routine preventive maintenance operations on the thermal reactor to ensure that the reactor is performing repeatably as compared to the pre-maintenance condition. Similarly, the present invention may be used after the installation of new equipment or upgrades to the thermal reactor to configure the thermal reactor for operation. The present invention may likewise be used to isolate the causes of non-uniformities and defects. For example, upon observing a defect or non-uniformity, a manufacturing operator can use the method of the present invention to determine if the non-uniformity or defect is due to a temperature variation. If the monitor wafer exhibits no color variations, then the non-uniformity or defect is probably due to causes other than temperature variations, such as gas flow variations. Moreover, the present invention enables the rapid adjustment of thermal reactors and substantially reduces reactor down time for non-production uses.

Those skilled in the art may practice the principles of the present invention in other specific forms without departing from its spirit or essential characteristics. Accordingly, the disclosed embodiments of the invention are merely illustrative and do not serve to limit the scope of the invention set forth in the following claims.

What is claimed is:

1. A method of adjusting temperature control in a semiconductor integrated circuit processing chamber, comprising:

depositing a test layer on a monitor substrate within the chamber;

observing interference colors from the layer across the substrate; and adjusting at least one parameter affecting temperature in the chamber, wherein adjusting is determined by the observed interference colors across the monitor substrate.

2. The method of claim 1, wherein the test layer comprises polysilicon.

3. The method of claim 2, wherein the test layer is formed over a silicon oxide layer on the monitor substrate.

4. The method of claim 3, wherein the silicon oxide layer has a thickness of at least about 1,000 Å.

5. The method of claim 3, wherein forming the test layer includes forming a seed silicon layer followed by forming a further polysilicon layer.

6. The method of claim 1, wherein forming the seed silicon layer comprises depositing an amorphous slicon layer.

7. The method of claim 1, wherein observing interference colors comprises viewing a plurality of points across the monitor substrate from a consistent angle to the test layer.

8. The method of claim 1, wherein adjusting at least one parameter comprises adjusting a temperature offset of at least one temperature controller.

9. The method of claim 1, wherein adjusting at least one parameter comprises adjusting a plurality of temperature controllers associated with a plurality of temperature zones of the monitor substrate, wherein adjusting each of the temperature controllers is determined by the observed interference color in an associated temperature zone of the monitor substrate.

10. The method of claim 1, wherein forming the test layer comprises depositing material under a first set of deposition conditions, and wherein adjusting at least one parameter comprises:

providing a reference listing a plurality of colors and a corresponding plurality of parameter adjustments for a temperature controller for depositing the layer under the first set of deposition conditions;

finding the observed interference color on the reference and determining the corresponding parameter adjustment from the reference; and adjusting the temperature controller using the corresponding parameter adjustment.

11. The method of claim 1, wherein forming the test layer comprises depositing material under a first set of deposition conditions, wherein adjusting at least one parameter comprises adjusting a plurality of temperature controllers associated with a plurality of temperature zones of the monitor substrate, and wherein adjusting the plurality of temperature controllers comprises:

providing a reference listing a plurality of colors and a corresponding plurality of parameter adjustments for depositing the layer under the first set of deposition conditions;

finding the observed interference color on the reference and determining the corresponding parameter adjustment from the reference for each temperature zone of the monitor substrate; and adjusting the plurality of temperature controllers using the corresponding parameter adjustments.

12. The method of claim 1, wherein depositing the test layer comprises chemical vapor deposition.

13. The method of claim 1, wherein adjusting at least one parameter comprises adjusting an input of a temperature controller setpoint.

14. The method of claim 1, wherein adjusting at least one parameter comprises adjusting a spacing between a heater element and a substrate mounted within the chamber.

15. A method of adjusting a multi-zone temperature control system for an integrated circuit fabrication tool, comprising:

loading a monitor substrate within the tool, the tool having a plurality of temperature control zones associated with a corresponding plurality of heating elements and at least one temperature controller;

forming a test layer on the monitor substrate within the tool while controlling the heating elements with the at least one temperature controller;

determining interference colors from the test layer in a plurality of substrate zones corresponding to the temperature control zones;

correlating the interference colors in each substrate zone with a difference in substrate zone temperature while forming the test layer; and adjusting the at least one temperature controller with adjustments corresponding to the correlated differences in temperature.

16. The method of claim 15, wherein correlating the interference colors comprises referring to a chart indicating a plurality of temperature differences for a corresponding plurality of interference colors and finding the determined interference colors on the chart.

17. The method of claim 15, wherein forming the test layer comprises chemical vapor deposition.

18. The method of claim 15, wherein each of the temperature control zones are associated with a separate temperature controller.

19. The method of claim 15, wherein forming the test layer comprises setting process parameters for a target thickness of the test layer, and the correlated differences in temperature are differences between a temperature that results in the target thickness and the temperatures that result in the interference colors.

20. A chart correlating interference color of a portion of a layer deposited upon a test work piece mounted within a semiconductor fabrication process chamber, the chart comprising a list of observed colors and a list of corresponding adjustments of a temperature controller in a temperature control zone encompassing the portion of the layer when mounted within the process chamber, the corresponding adjustments for each of the listed observed colors being calculated for a single target thickness of the layer.

21. The chart of claim 20, wherein the corresponding adjustments comprise temperature offsets for the temperature controller.

22. A method of preparing a color-to-temperature adjustment reference, comprising;

depositing a test layer on a monitor work piece within a processing chamber under a set of deposition conditions calculated for a target test layer thickness;

identifying a first region of the test layer having a first color;

measuring a first thickness of the test layer within the first region;

calculating a first temperature controller adjustment for achieving the target test layer thickness within the first region of the test layer; and correlating the first color with the first temperature controller adjustment on the reference.

23. The method of claim 22, wherein the first temperature controller adjustment comprises a temperature offset.

24. The method of claim 22, further comprising:

depositing a second test layer on a second monitor work piece within the processing chamber under the set of deposition conditions calculated for the target test layer thickness;

identifying a second region of the test second layer having a second color;

measuring a second thickness of the second test layer within the second region;

calculating a second temperature controller adjustment for achieving the target test layer thickness within the second region of the second test layer; and correlating the second color with the second temperature controller adjustment on the reference.

* * * * *

UNITED STATES PATENT AND TRADEMARK OFFICE
CERTIFICATE OF CORRECTION

PATENT NO.    : 6,126,744
DATED         : October 3, 2000
INVENTOR(S)   : Hawkins et al.

It is certified that error appears in the above-identified patent and that said Letters Patent is hereby corrected as shown below:

Column 6,
Line 48, please replace "elongate4" with -- elongated --.
Line 52, please replace "elongted" with -- elongated --.

Column 17,
Line 39, please replace "medge" with -- edge --.

Signed and Sealed this

Twenty-fifth Day of February, 2003

JAMES E. ROGAN
*Director of the United States Patent and Trademark Office*